(12) United States Patent
Chandhok et al.

(10) Patent No.: US 9,385,085 B2
(45) Date of Patent: Jul. 5, 2016

(54) INTERCONNECTS WITH FULLY CLAD LINES

(71) Applicant: INTEL CORPORATION, Santa Clara, CA (US)

(72) Inventors: Manish Chandhok, Beaverton, OR (US); Hui Jae Yoo, Hillsboro, OR (US); Christopher J. Jezewski, Hillsboro, OR (US); Ramanan V. Chebiam, Hillsboro, OR (US); Colin T. Carver, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/855,792

(22) Filed: Sep. 16, 2015

(65) Prior Publication Data

US 2016/0005692 A1 Jan. 7, 2016

Related U.S. Application Data

(63) Continuation of application No. 14/039,893, filed on Sep. 27, 2013, now Pat. No. 9,165,824.

(51) Int. Cl.
*H01L 23/48* (2006.01)
*H01L 23/52* (2006.01)
*H01L 29/40* (2006.01)
*H01L 23/532* (2006.01)
(Continued)

(52) U.S. Cl.
CPC ...... *H01L 23/53238* (2013.01); *H01L 21/7682* (2013.01); *H01L 21/76841* (2013.01); *H01L 21/76843* (2013.01); *H01L 21/76849* (2013.01); *H01L 21/76882* (2013.01); *H01L 21/76883* (2013.01); *H01L 23/5222* (2013.01); *H01L 23/53295* (2013.01); *H01L 23/5283* (2013.01); *H01L 2924/0002* (2013.01)

(58) Field of Classification Search
USPC ................... 257/E23.169–E23.178, 98, 99; 438/629, 630, 637–640, 668, 672, 675
See application file for complete search history.

(56) References Cited

U.S. PATENT DOCUMENTS 6,229,211 B1 5/2001 Kawanoue et al.
6,433,429 B1 8/2002 Stamper
(Continued)

OTHER PUBLICATIONS

Kapur et al., "Technology and Reliability Constrained Future Copper Interconnects—Part 1: Resistance Modeling", IEEE Transactions on Electron Devices, vol. 49, No. 4, Apr. 2002.
(Continued)

*Primary Examiner* — Dao H Nguyen
*Assistant Examiner* — Tram H Nguyen
(74) *Attorney, Agent, or Firm* — Grossman, Tucker, Perreault & Pfleger, PLLC

(57) ABSTRACT

A metallization layer including a fully clad interconnect and a method of forming a fully clad interconnect. An opening is formed in a dielectric layer, wherein the dielectric layer has a surface and the opening includes walls and a bottom. A diffusion barrier layer and an adhesion layer are deposited on the dielectric layer. An interconnect material is deposited on the dielectric layer and reflowed into the opening forming an interconnect. An adhesion capping layer and diffusion barrier capping layer are deposited over the interconnect. The interconnect is surrounded by the adhesion layer and the adhesion capping layer and the adhesion layer and the adhesion capping layer are surrounded by the diffusion barrier layer and the diffusion capping layer.

17 Claims, 14 Drawing Sheets

(51) Int. Cl.
  *H01L 21/768* (2006.01)
  *H01L 23/522* (2006.01)
  *H01L 23/528* (2006.01)

(56) References Cited

U.S. PATENT DOCUMENTS

| | | | |
|---|---|---|---|
| 6,452,276 B1* | 9/2002 | Cohen | H01L 21/76843 257/763 |
| 6,599,828 B1 | 7/2003 | Gardner | |
| 6,734,559 B1* | 5/2004 | Yang | H01L 21/76843 257/750 |
| 7,220,665 B2 | 5/2007 | Farrar | |
| 7,977,228 B2 | 7/2011 | Ramachandrarao | |
| 2004/0097065 A1* | 5/2004 | Lur | H01L 21/76807 438/619 |
| 2006/0046456 A1* | 3/2006 | An | H01L 21/2885 438/597 |
| 2006/0113675 A1* | 6/2006 | Chang | H01L 21/76814 257/763 |
| 2006/0154465 A1 | 7/2006 | Suh et al. | |
| 2006/0258142 A1 | 11/2006 | Haider et al. | |
| 2008/0073748 A1 | 3/2008 | Bielefeld et al. | |
| 2012/0007242 A1 | 1/2012 | He et al. | |
| 2012/0064718 A1 | 3/2012 | Gambino et al. | |

OTHER PUBLICATIONS

Kapur et al., "Technology and Reliability Constrained Future Copper Interconnects—Part II: Performance Implications", IEEE Transactions on Electron Devices, vol. 49, No. 4, Apr. 2002.

Pratt, "Overview of the Use of Copper Interconnects in the Semiconductor Industry", Advanced Energy.

International Search Report and Written Opinion received for PCT Patent Application No. PCT/US2014/057351, mailed on Dec. 30, 2014, 14 pages.

Office Action received for Taiwan Patent Application No. 103132991, mailed on Dec. 23, 2015, 6 pages of English translation and 7 pages of Taiwanese Office Action.

International Preliminary Report on Patentability received for PCT Application No. PCT/US2014/057413, mailed Apr. 1, 2016, 11 pages.

* cited by examiner

US 9,385,085 B2

INTERCONNECTS WITH FULLY CLAD LINES

CROSS-REFERENCE TO RELATED APPLICATIONS

The present application is a continuation of U.S. patent application Ser. No. 14/039,893 titled "Interconnects With Fully Clad Lines" filed on Sep. 27, 2013, the entire disclosure of which is incorporated herein by reference.

FIELD

The present disclosure relates to interconnects having fully clad lines, and in particular embodiments, copper interconnects including fully clad conducting lines.

BACKGROUND

As integrated circuit features are scaled down and density increases, material properties such as resistivity, which influences observed resistance, exhibit relatively more pronounced effects. In addition, the reliability of integrated circuits is affected by a number of stresses that increase as feature size drops and density increases. These stresses include electrical, thermal, mechanical and environmental stress. Electromigration is an example of phenomena that reduce semiconductor reliability, lead to interconnect failure, and become relatively more prominent as feature size decreases, particularly below 50 nm, and power density increases. Electromigration is understood as the transport of material due to movement of ions in a conductor. Electromigration may result in the formation of hillocks or voids within the interconnect, and eventually lead to its failure.

To reduce electromigration, and other stress induced failures, refractory metals have been used in interconnect fabrication. However, refractory metals exhibit increased resistivity and, therefore, increased resistance and resistive-capacitance (RC) delay. To further reduce electromigration, and other stress induced failures, diffusion barriers have been deposited on the side and bottom walls of openings in interlayer dielectrics containing the interconnects. Diffusion barriers are understood to typically occupy a small fraction of the cross-sectional area of the interconnect line. The portion of the interconnect exposed at the surface of a given dielectric layer is coated with an insulator such as silicon nitride. However, the use of an insulative capping layer may adversely affect line performance by increasing capacitive coupling.

Therefore, as feature sizes continue to decrease, room remains for the improvement in the design of interconnects with, in some instances, an emphasis on both interconnect RC and resistance to various stresses, such as those resulting in electromigration and thermomechanical failures.

BRIEF DESCRIPTION OF THE DRAWINGS

The above-mentioned and other features of this disclosure, and the manner of attaining them, may become more apparent and better understood by reference to the following description of embodiments described herein taken in conjunction with the accompanying drawings, wherein.

DETAILED DESCRIPTION

Figure 1A:
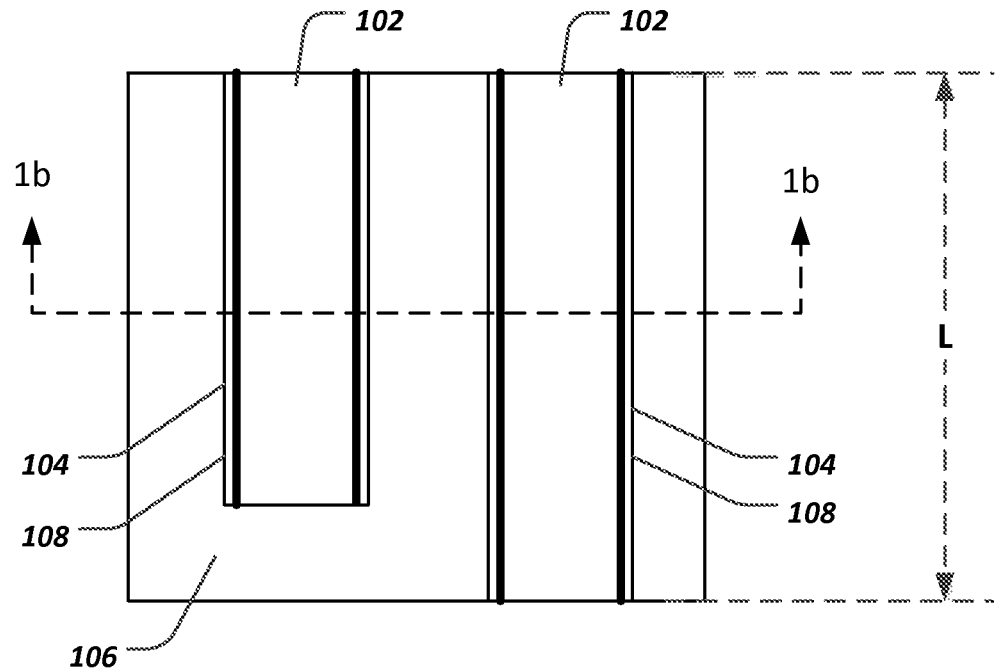
FIG. 1a illustrates a top view of an embodiment of fully clad interconnect lines in an interlayer dielectric.

The present disclosure is directed to interconnects having fully clad lines and, in particular embodiments, copper interconnects including fully clad conducting lines. As noted above, as integrated circuit features are scaled down and density increases, material properties such as resistivity, which influences observed resistance, exhibit relatively more pronounced effects. In addition, the reliability of integrated circuits is affected by a number of stresses that increase as feature size drops and density increases. These stresses include electrical, thermal, mechanical and environmental stress. Electromigration is an example of phenomena that reduces semiconductor reliability, leads to interconnect failure, and becomes relatively more prominent as feature size is decreased, particularly below 50 nm dimensions, and power density increases. Electromigration is understood as the transport of material due to movement of ions in a conductor. Electromigration may result in the formation of hillocks or voids in the interconnects and eventually lead to failure.

To reduce electromigration, and other stress induced failures, refractory metals or doped copper have been used in interconnect fabrication as the conductors or lines. However, refractory metals exhibit increased resistivity and, therefore, increased resistance, increasing resistive-capacitance delay. To further reduce electromigration, and other stress induced failures, diffusion barriers have been deposited on the side and bottom walls of openings in interlayer dielectrics containing the interconnects. Diffusion barriers are understood to typically occupy a small fraction of the cross-sectional area of the interconnect line. The portion of the interconnect exposed at the surface of a given dielectric layer is commonly coated with a hermetic etch stop. Hermetic etch stops generally include insulators with relatively high dielectric constant, such as silicon nitride, silicon carbide films or hydrogenated silicon carbide films. However, such an arrangement may adversely affect line properties such as capacitance. In an attempt to address the drawbacks of electromigration, the present disclosure is directed to interconnects, and particularly copper interconnects, including fully clad lines and a method of forming such interconnects.

In embodiments, the interconnects are used to connect various components associated with an integrated circuit. Components include, for example, transistors, diodes, power sources, resistors, capacitors, inductors, sensors, transceivers, receivers, antennas, etc. Components associated with an integrated circuit include those that are mounted on an integrated circuit or those connected to an integrated circuit. The integrated circuit is either analog or digital and may be used in a number of applications, such as microprocessors, optoelectronics, logic blocks, audio amplifiers, etc., depending on the components associated with the integrated circuit. The integrated circuit may be employed as part of a chipset for executing one or more related functions in a computer.

Figure 1B:
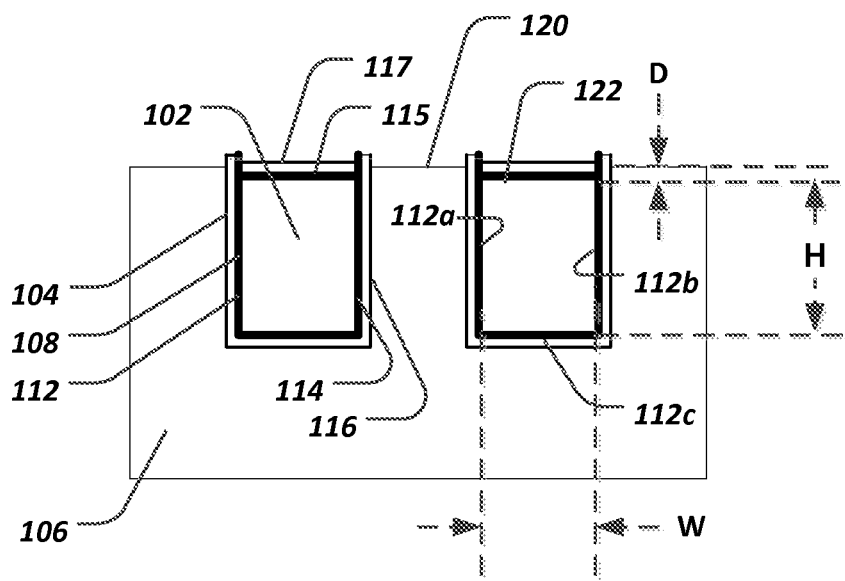
FIG. 1b illustrates a cross-section of FIG. 1a taken at line 1b-1b.
Figure 2A:
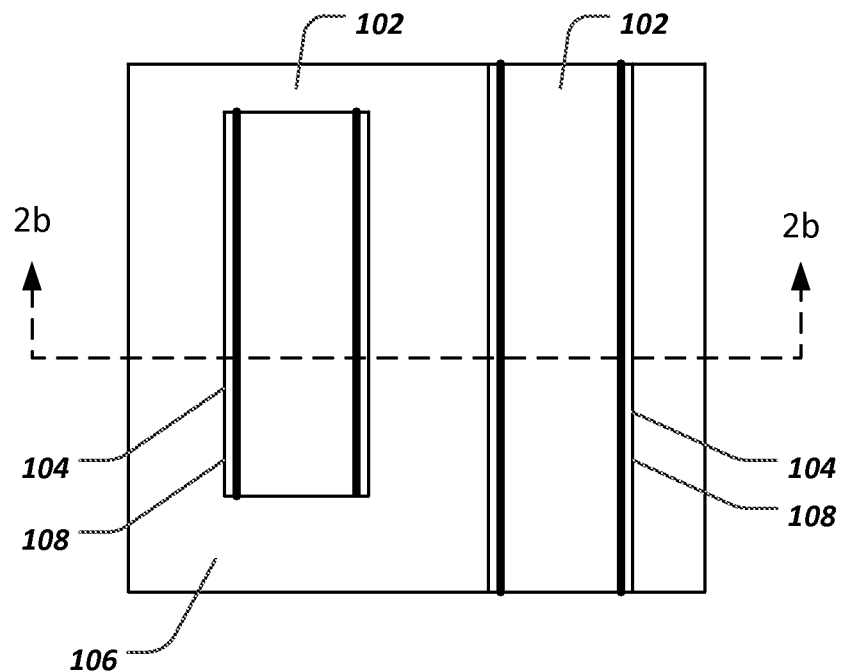
FIG. 2a illustrates a top view of an embodiment of fully clad interconnect lines in an interlayer dielectric.
Figure 2B:
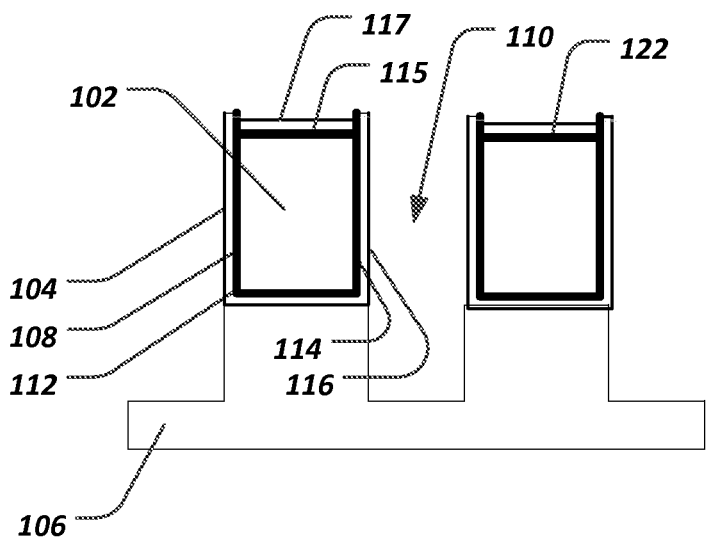
FIG. 2b illustrates a cross-section of FIG. 2a taken at line 2b-2b.

FIGS. 1a and 1b illustrate a top view and a cross-sectional view, respectively, of an embodiment of a metallization layer including fully clad interconnect lines 102 formed in an opening 104 in a dielectric layer 106. The fully clad interconnect lines include a diffusion barrier 108 on all sides 112 of the interconnect 102, such that the interconnect 102 is surrounded by the diffusion barrier 108. FIGS. 2a and 2b illustrate a top view and cross-sectional view, respectively, of another embodiment, wherein an air gap 110 is present between the fully clad interconnects 102. Again, the interconnect lines 102 are surrounded by a diffusion barrier 108 on all sides 112 of the interconnect line 102. A dielectric layer 106 supports the interconnect lines 102.

In embodiments, the dielectric layer 106 is an interlayer dielectric. Two or more layers of the interlayer dielectric may be stacked to form an integrated circuit. In some embodiments, discussed further herein, the dielectric layer includes one or more sacrificial layers deposited over a dielectric substrate. The dielectric layer includes a dielectric material, which is understood to be a material that is an insulator but is polarized upon application of an electric field. In embodiments, the dielectric includes a low-k dielectric, that is, a material with a dielectric constant that is lower than 3.9, i.e., the dielectric constant of silicon dioxide, including all values and ranges from 1.5 to 3.8, such as 1.7, 1.9, 2.1, 2.8, 2.7, etc. Non-limiting examples from which the dielectric material may be selected include fluorine-doped silicon dioxide, carbon doped oxide (i.e., carbon-doped silicon dioxide), organo silicate glass, silicon oxycarbide, hydrogenated silicon oxycarbide, porous silicon dioxide, and organic polymer dielectrics such as polyimide, polytetrafluoroethylene, polynorbornenes, benzocyclobutene, hydrogen silsesquioxane and methylsilsesquioxane. The dielectric layer may have a thickness in the range of 50 nm to 300 nm, including all values and ranges therein, such as 100 nm to 300 nm, 100 nm to 200 nm, etc.

As illustrated, the interconnects 102 are rectangular in cross-section. However, in various embodiments, other geometries may be assumed such as square, oblong, elliptical or variations thereof. The interconnects are formed of a material having a resistivity p of less than 4.0 μΩ·cm, such as in the range of 1.0 μΩ·cm to 4.0 μΩ·cm. For example, the interconnects include, consist of, or consist essentially of copper. As illustrated, the interconnects have a length L, (see FIG. 1a), width W and height H, excluding any additional barrier layers, where in embodiments the length exhibits the largest dimension of the interconnect. In embodiments, the interconnects have a length L in the range of a few tenths of a micron to several microns, including all values and ranges therein, a width W in the range of 0.020 μm to 0.100 μm including all values and ranges therein, and a height H in a range that provides aspect ratios (H/W) of 0.5 to 2.0 including all values and ranges therein.

Further, as illustrated in FIG. 1b, the upper surface 122 of the interconnects 102 are recessed below the surface 120 of the dielectric layer 106. The interconnects 102 are recessed a distance D, which, in embodiments, is in the range of 1% to 20% of the height of the interconnect, including all values and ranges therein, such as 5% to 10%, etc. For example, the interconnect is recessed a distance D in the range of 1 nm to 20 nm, including all values and ranges therein, such as 5 nm to 10 nm, from the surface of the dielectric layer 106. This defines a recess 138 (see FIG. 5d further described below) between the upper surface 122 of the interconnects 102 and the dielectric surface 120.

As noted above, the interconnects 102 are fully clad with a barrier layer 108 including an adhesion layer 114 and diffusion barrier layer 116 and are capped with the adhesion capping layer 115 and the diffusion barrier capping layer 117. Fully clad is understood as the barrier layer 108 fully surrounds all of the surfaces 112, including upper surface 122, opposing side surfaces 112a, 112b and bottom surface 112c, of the interconnects 102, including those surfaces that are not surrounded or bordered by the dielectric 106 (upper surface 122). When vias are present, the cladding encapsulates both the vias and the lines together. In embodiments, the diffusion barrier layer 116 is disposed on the dielectric layer 106 and the adhesion layer is disposed on the side walls 134 and bottom 132 of the opening 104 and the adhesion layer 114 is disposed on the diffusion barrier layer 116. Further, the adhesion capping layer 115 is disposed over the interconnect 102 and the diffusion barrier capping layer is disposed over the adhesion capping layer 115. The interconnect 102 being surrounded by the adhesion layer 114 and the adhesion capping layer 115, which is in turn surrounded by the diffusion barrier layer 116 and the diffusion barrier capping layer 117, respectively.

In embodiments, the adhesion layers 114, 115 are composed of materials that wet the conducting metal, for example copper, sufficiently to provide good adhesion to the same. The material selected for the adhesion layers exhibits a higher resistivity than that of the interconnect, such as in the range of 5.0 μΩ·cm to 100.0 μΩ·cm. The adhesion layers include, for example, tantalum, titanium, ruthenium, or cobalt, and, in particular embodiments consists essentially of tantalum. In embodiments, the adhesion layers 114, 115 each have a thickness in the range of 1 nm to 10 nm, including all values and ranges therein.

Figure 3:
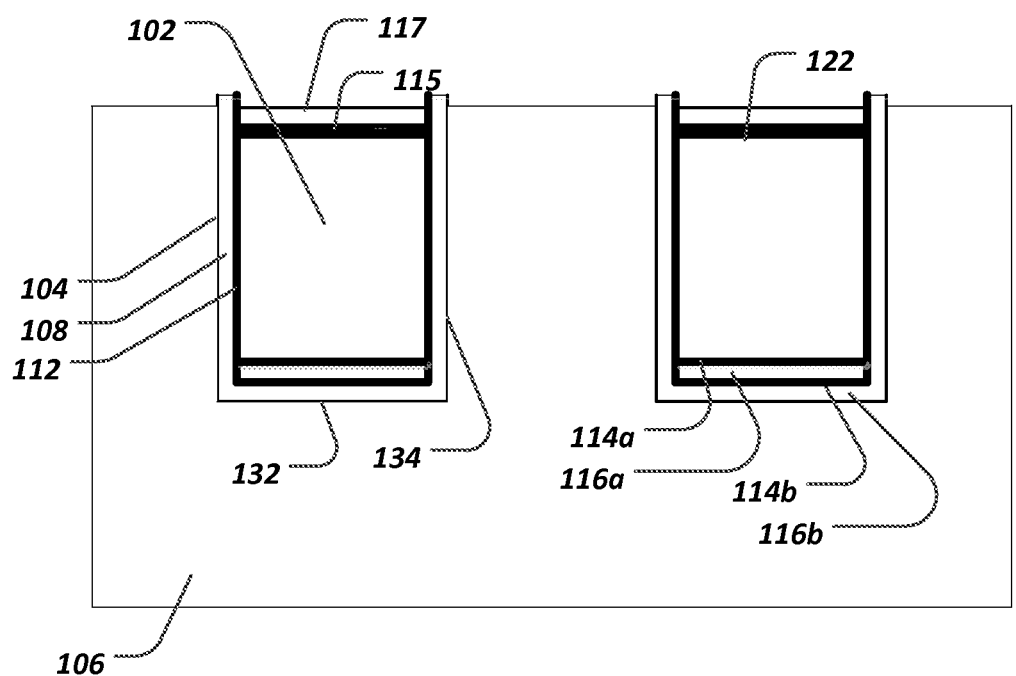
FIG. 3 illustrates a cross-section of another embodiment of fully clad interconnect lines, including a double barrier layer at the bottom of the interconnect opening, each barrier layer including an adhesion layer and diffusion layer.

However, as the adhesion layers may be subject to oxidation, the diffusion barrier layer 116 is provided between the adhesion layer 114 and the dielectric 106. In addition, a diffusion barrier capping layer 117 is formed over the adhesion capping layer 115, capping the adhesion capping layer 115. The diffusion barrier layers 116, 117 include, for example, tantalum nitride or titanium nitride and, in particular embodiments includes, consists of, or consists essentially of tantalum nitride. In embodiments, the diffusion barrier layers 116, 117 each have a thickness in the range of 1 nm to 10 nm, including all values and ranges therein. In embodiments, multiple adhesion layers and diffusion barrier layers are provided at one or more locations around the surface 112 of the interconnects 102. For example, at the bottom 132 of the opening 104, two or more alternating layers of the adhesion and diffusion barrier materials are provided. The cross-section of FIG. 3 illustrates two adhesion layers 114a, 114b and two diffusion barrier layers 116a, 116b are provided.

An embodiment of a method of forming the fully clad interconnects in a metallization layer described above is illustrated in FIG. 4. FIGS. 5a through 5i illustrate the configuration of the metallization layer as the method of forming the fully clad interconnects progresses. In this embodiment, the method 400 begins with patterning the dielectric layer to define a number of openings in the dielectric layer surface in which the interconnects will be formed.

In an embodiment, patterning includes depositing a photoresist over the dielectric layer. The photoresist is a positive or negative resist and may include for example, poly(methyl methacrylate), poly(methyl glutarimide), DNQ/novolac, or SU-8 (an expoxy based negative resist). The photoresist is deposited by a casting process such as, for example, spin-coating. Spin coating is performed at 1 to 10,000 rpm, including all values and ranges therein, for a time period in the range of 1 second to 10 seconds, including all values and ranges therein.

The photoresist is then patterned by optically projecting an image of a desired pattern onto the photoresist using photolithography, such as optical photolithography, immersion photolithography, deep UV lithography, extreme UV lithography, or other techniques, wherein the wavelength of projected light may be up to 436 nm, including all values and ranges from 157 nm to 436 nm, such as 157 nm, 193 nm, 248 nm, etc. A developer, such as tetramethylammonium hydroxide TMAH (with or without surfactant) at a concentration of in the range of 0.1 N to 0.3 N, is applied to the photoresist, such as by spin-coating, and portions of the photoresist are removed to expose regions of the underlying dielectric layer correlating to the desired pattern.

In embodiments, baking of the dielectric may occur before or after any of the above steps. For example, the dielectric layer may be prebaked to remove surface water. In examples, prebaking is performed at a temperature in the range of 200° C. to 400° C., including all values and ranges therein, for a time of 30 to 60 minutes, including all values and ranges therein. After application of the photoresist, a post application bake may occur, wherein at least a portion of the solvents in the photoresist are driven off. A post application bake is, for example, performed at temperatures in the range of 70° C. to 140° C., including all values and ranges therein, for a time period in the range of 60 seconds to 240 seconds, including all values and ranges therein. After patterning, the resist may be hard baked at a temperature in the range of 100° C. to 300° C., including all values and ranges therein, for a time period of 1 minute to 10 minutes, including all values and ranges therein.

Figure 5A:
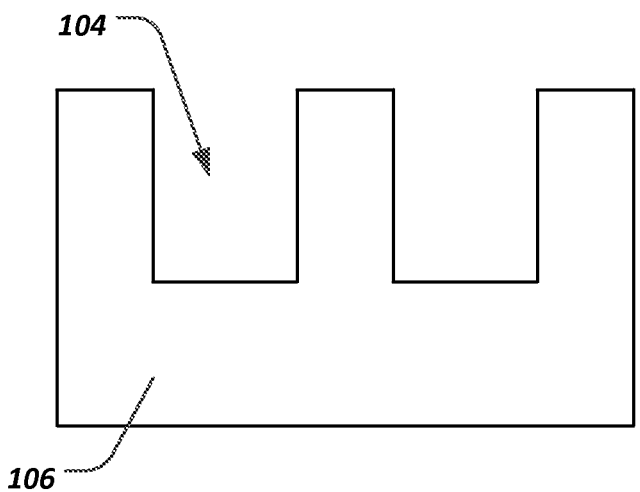
FIG. 5a illustrates a cross-section of an embodiment of a patterned openings interlayer dielectric.

The exposed portions of the dielectric layer are then chemically etched, wherein the exposed portions of the surface are removed until a desired depth is achieved, forming openings in the dielectric layer. The remaining photoresist is optionally removed via a process such as ashing, wherein the photoresist is exposed to oxygen or fluorine, which combines with the photoresist to form ash. FIG. 5a illustrates an embodiment of a patterned interlayer dielectric 106 including one or more openings 104 formed in a surface 120 of the dielectric 106. The dielectric at least partially isolates the openings both physically and electrically.

Referring again to FIG. 4, after patterning the dielectric layer, the diffusion barrier is deposited onto the dielectric 404. In embodiments, deposition of the diffusion barrier is performed using a conformal coating process, wherein the diffusion barrier is deposited on any exposed surface of the dielectric layer, including on the sidewalls and bottom of any opening formed in the dielectric layer. A conformal coating may, therefore, be understood as a coating that is applied to exposed surfaces of the dielectric layer, and not, for example, just to horizontal surfaces. In embodiments, the coating exhibits a variation in thickness of less than 35%, including all values and ranges from 1% to 35%, such as 10% or less, 15% or less, 20% of less, 25% or less, etc. The conformal coating process is selected from a process such as chemical vapor deposition or atomic layer deposition. Other processes that may be used include physical vapor deposition such as, magnetron sputtering, evaporative deposition or e-beam deposition.

In chemical vapor deposition, for example, one or more reactive gases are provided in a chamber including the interlayer dielectric at a flow rate of 5 sccm to 500 sccm, including all values and ranges therein. In examples the reactive gas is selected from one or more of the following: pentakis(dimethylamino)tantalum, tris(diethylamido)(tert-butylimido) tantalum(V), tris(ethylmethylamino)(tert-butylimido)tantalum(V), or titanium tetrachloride and ammonia provided at a 1:1 stoichiometric ratio. The reactive gas may be provided with a carrier gas, such as an inert gas, which may include, for example, argon.

In embodiments, the chamber is maintained at a pressure in the range of 1 mTorr to 100 mTorr, including all values and ranges therein, and a temperature in the range of 100° C. to 500° C., including all values and ranges therein. The process may, in embodiments, be plasma assisted where electrodes are provided within the process chamber and are used to ionize the gases. Or, a plasma is formed outside of the chamber and is then supplied into the chamber. In the chamber, a layer of the metal is deposited on the surface of the dielectric due to reaction of the gas.

In physical vapor deposition a workpiece (the dielectric) is placed in a process chamber. A reactive gas, such nitrogen, is supplied to the process chamber at a flow rate in the range of 10 sccm to 100 sccm, including all values and ranges therein such as 40 sccm to 50 sccm or 45 sccm. An inert gas, such as argon, is optionally supplied into the process chamber as well. Prior to supplying the reactive gas, the base pressure of the process chamber is in the range of $10^{-8}$ torr and is held at a pressure in the range of $10^{-7}$ to $10^{-1}$ torr during sputtering, such as in the range of 1 millitorr to 10 millitorr, or 2.5 millitorr. The process chamber is maintained at a temperature in the range of 10° C. to 100° C., including all values and ranges therein, such as in the range of 10° C. to 20° C. or 17° C.

A metal target is positioned in the process chamber and is formed of a metal such as titanium or tantalum. The metal target is biased by a DC sources rated in the range of −50 V to −1000 V, including all values and ranges therein. The workpiece, or worktable, may also be biased by an AC source rated in the range of −50 V to −100 V including all values and ranges therein, such as −70 to −80 V.

During deposition, a plasma forms and is localized around the target due to magnets positioned proximal to or behind the target. The plasma bombards the target sputtering away the metal atoms as a vapor, which is then deposited on the workpiece. The process continues for a time period in the range of 1 second to 100 seconds.

Figure 5B:
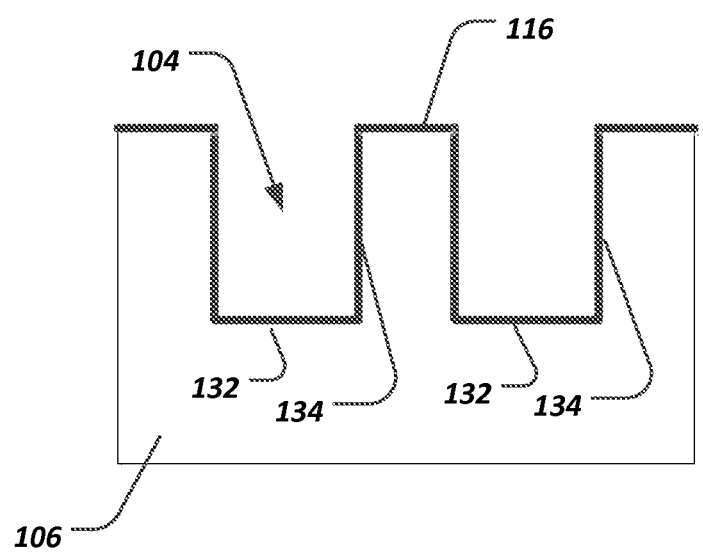
FIG. 5b illustrates a cross-section of the patterned interlayer dielectric of FIG. 5a including a layer of a diffusion barrier deposited thereon.

FIG. 5b illustrates an embodiment of an interlayer dielectric 106 including a conformal coating 116 of the diffusion barrier material over the surfaces 120 of the interlayer dielectric 106, as well as on the walls 134 and bottom 132 of the openings 104.

Figure 4:
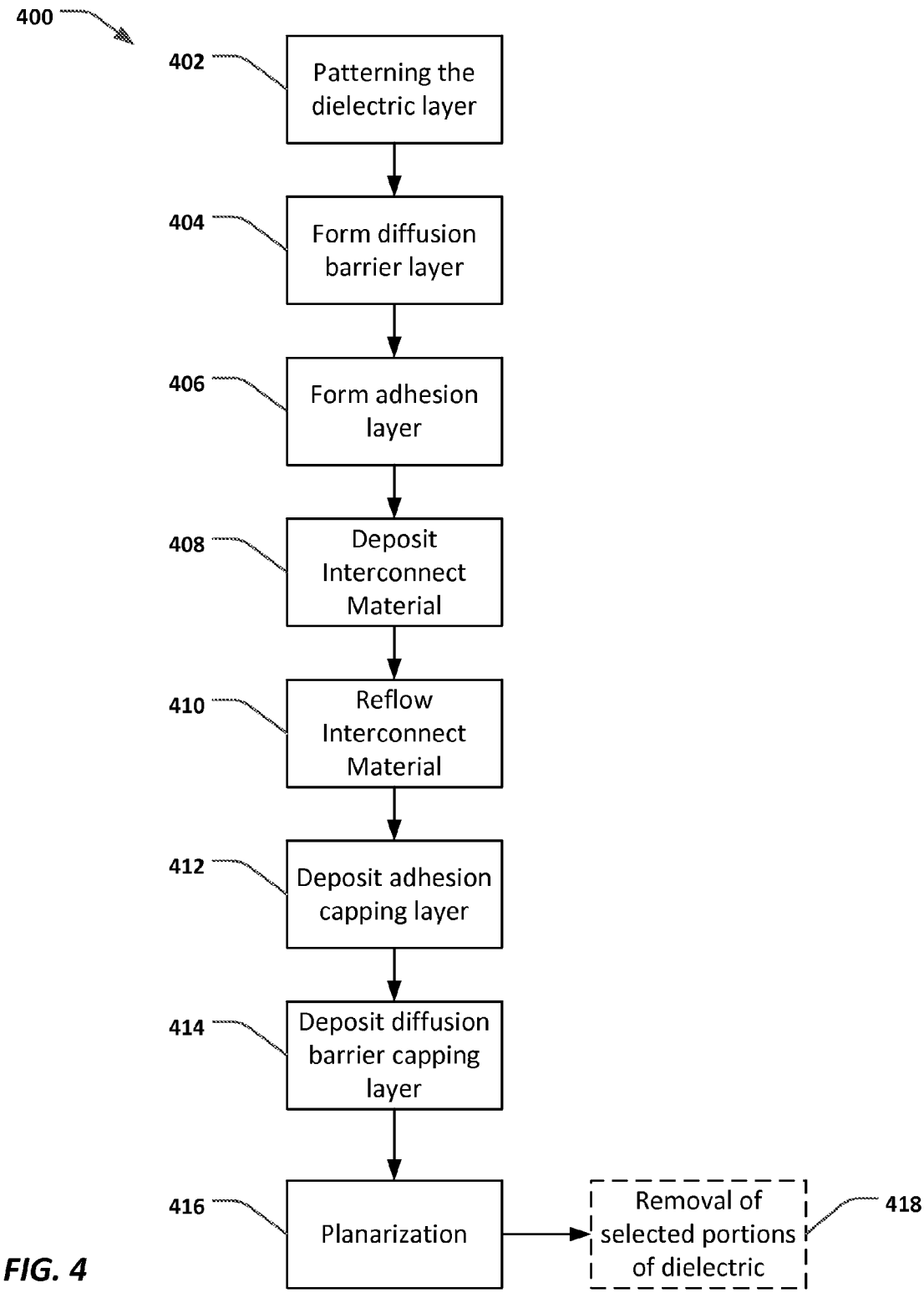
FIG. 4 illustrates an embodiment of a method of forming the fully clad interconnects.

After depositing the diffusion barrier layer, the adhesion layer is deposited 406 as seen in FIG. 4. In embodiments, the adhesion layer is deposited using any of the above conformal coating processes. Again, the adhesion layer is deposited on any exposed surface of the diffusion barrier layer, including on the sidewalls and bottom of the openings. In examples, the reactive gas is selected from tantalum(V)chloride, i.e., bis(tert-butylcyclopentadienyl)titanium(IV) dichloride, which is delivered with hydrogen at a 1:1 stoichiometric ratio. Again, the reactive gas may be delivered with an inert gas, such as argon. Physical vapor deposition of the adhesion layer proceeds as described above with respect to the diffusion barrier layer, with a few exceptions. For example, during deposition of the diffusion barrier, a reactive gas, such as nitrogen gas, is not fed into the process chamber. Otherwise, the processes remain similar.

Figure 5C:
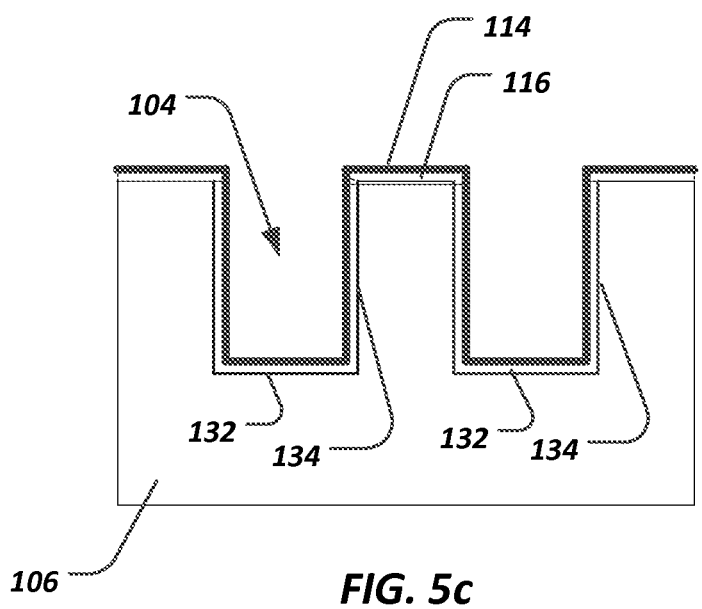
FIG. 5c illustrates a cross-section of the interlayer dielectric of FIG. 5b including an adhesion layer deposited on the diffusion barrier layer.

FIG. 5c illustrates the addition of the adhesion layer 114 over the diffusion barrier 116, wherein the adhesion layer is deposited over the surfaces 120 of the dielectric, the walls 134 and the bottom 132 of the opening 104.

Referring again to FIG. 4, the interconnect material may then be deposited using a vapor deposition method 408, such as chemical vapor deposition or physical vapor deposition. The interconnect material is deposited over various surfaces of the dielectric. Sufficient interconnect material is applied to only partially fill the openings, leaving a recess between the surface of the dielectric and the surface of the interconnects.

Physical vapor deposition processes for depositing the lines again include, for example, magnetron sputtering, evaporative deposition or e-beam deposition. An example of physical vapor deposition includes supplying an inert gas, such as argon, at a flow rate in the range of 5 sccm to 100 sccm, including all values and ranges therein, into a process chamber, which is held at a pressure in the range of $1\times10^{-1}$ torr to $10^{-7}$ torr, including all values and ranges therein. The process chamber includes a workpiece, i.e., the dielectric, and a metal source, called a target, formed of copper or aluminum. The metal source is biased by a DC source rated in the range of 0.1 kW to 50 kW, including all values and ranges therein. The workpiece, or worktable upon which the workpiece is positioned, may also be biased by an AC source rated in the range of 0.1 kW to 1.5 kW, including all values and ranges therein. A plasma forms and is localized around the target due to magnets positioned proximal to or behind the target. The plasma bombards the target sputtering away the metal atoms as a vapor, which is then deposited on the workpiece. The process continues for a time period in the range of 1 second to 100 seconds to allow growth of a layer of the interconnect material.

In embodiments a seed layer of the line material (such as copper), in the range of 400 Angstroms to 600 Angstroms, such as 500 Angstroms, is formed by the physical vapor deposition process described above. This is followed by the electroplating of copper wherein the interlayer dielectric is placed to a solution of copper sulfate and sulfuric acid. A current density in the range of 25 mA/cm² to 75 mA/cm², such as 50 mA/cm², was applied for a time period of 30 seconds to 120 seconds, such as 60 seconds.

In alternative embodiments, chemical vapor deposition may be performed to form the interconnects by the processes described above. The reactive gas is selected from, for example, Cu(II)bis-hexafluoroacetylacetonate, 1,5-cyclooctadiene-Cu(I)-hexafluoroacetylacetonate.

Figure 5D:
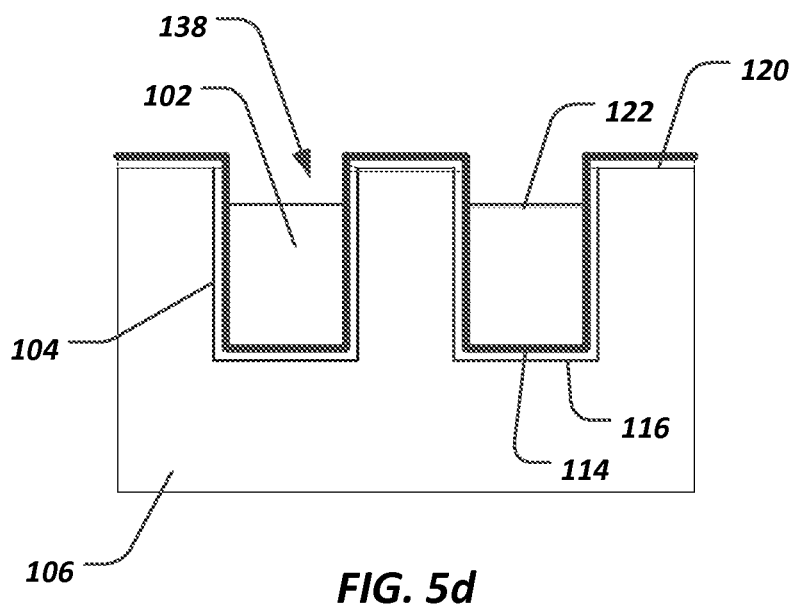
FIG. 5d illustrates a cross-section of the interlayer dielectric of FIG. 5c including the interconnect material deposited on the interlayer dielectric and reflowed into the openings.

Once the interconnect material is deposited on the dielectric, the interconnect material is then reflowed 410 to cause the interconnect material to flow into the openings 104. To reflow the interconnect material, the interconnect material is subject or exposed to elevated temperatures in the range of 200° C. to 1100° C., including all values and ranges therein, applied by radiative, furnace, lamp, microwave, or hot gas. The interconnect material may be reflowed for a time period in the range of 1 minute to 10 minutes, including all values and ranges therein. FIG. 5d illustrates an embodiment of the interconnect material after reflow. As illustrated, the material forming the interconnect 102 partially fills the openings 104 formed dielectric layer 106. As described above, the upper surface 122 of the interconnect is recessed from the upper surfaces 120 of the dielectric 106 at a depth in the range of 1 nm to 20 nm, including all values and ranges therein, such as 1 nm to 5 nm. This defines a recess 138 in the opening 104 above the upper surface 122 of the interconnect 102.

Figure 5E:
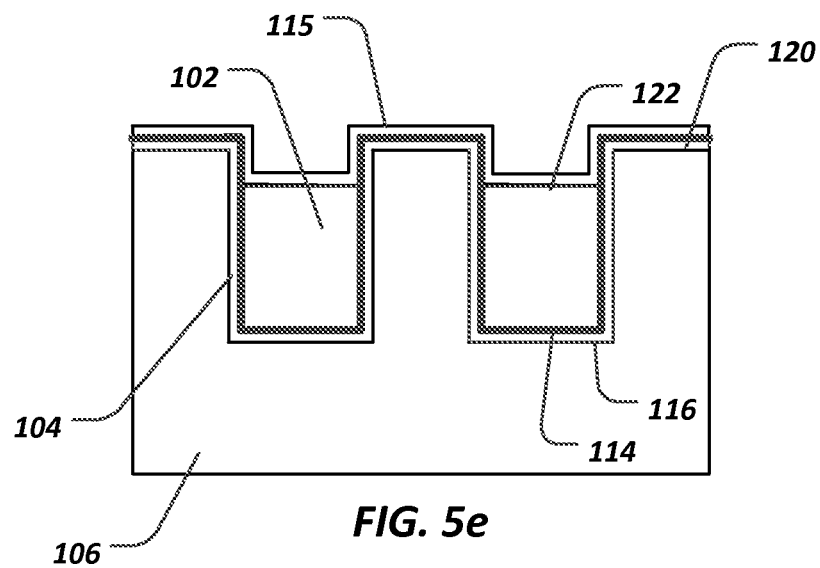
FIG. 5e illustrates a cross-section of the interlayer dielectric of FIG. 5d including an adhesion capping layer deposited over the interconnect and dielectric.

Referring again to FIG. 4, after deposition and reflow of the interconnect material, a capping layer of the adhesion material is deposited 412 over the dielectric and interconnect. In embodiments, a vapor deposition method is used, such as the conformal coating methods described above, or physical vapor deposition methods are used. In using chemical vapor deposition, the reactive gasses and deposition conditions, in embodiments, are the same as the reactive gasses and deposition conditions described above with regard to depositing the adhesion layer 114 in step 406. FIG. 5e illustrates the adhesion capping layer 115 disposed over the interconnect 102 and dielectric 106. The adhesion capping layer 115 being located within recess 138. This step may be followed by chemical mechanical planarization to reduce the height of the adhesive layer and the dielectric prior to capping with the diffusion barrier to allow the diffusion barrier to more fully encapsulate the adhesion layer 114, 115.

Figure 5F:
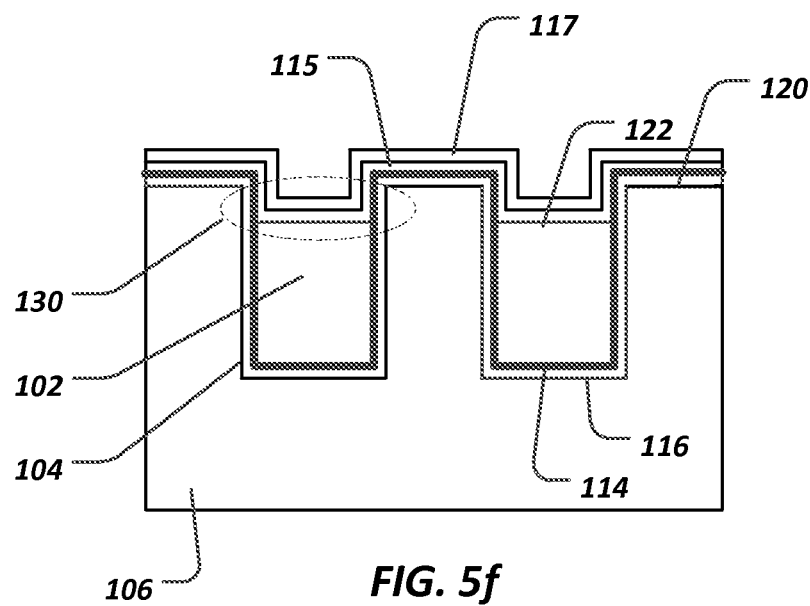
FIG. 5f illustrates a cross-section of the interlayer dielectric of FIG. 5e including a diffusion barrier capping layer deposited over the adhesion capping layer.

The capping layer of the diffusion barrier is then deposited 414 over the adhesion capping layer as illustrated in FIG. 4. Again, in embodiments, vapor deposition methods may be used, such as the conformal coating methods described above, or physical vapor deposition methods described above, to deposit the diffusion barrier. In using chemical vapor deposition, the reactive gasses and deposition conditions, in embodiments, are the same as the reactive gasses and deposition conditions described above with regard to depositing the diffusion barrier layer 116 described in step 404. FIG. 5f illustrates the diffusion barrier capping layer 117 deposited over the adhesion capping layer 115, the interconnects 102, and the dielectric 106. The diffusion barrier capping layer 117 being located within recess 138. Accordingly, the portion 130 of the capping layers 115, 117 located over the interconnects 102 remain level with or recessed from the interlayer dielectric surface 120.

Referring again to FIG. 4, after capping 414, planarization is performed 416 to expose the surfaces 120 of the dielectric material between the openings 104. Planarization is either performed using wet or dry planarization processes. In one embodiment, planarization is performed using chemical mechanical planarization, which may be understood as a process that utilizes a polishing surface, an abrasive and a slurry to remove the overburden and planarize the surface of the dielectric layer and interconnects. Due to the recess of the interconnect and capping layers relative to the surface of the dielectric layer, the capping layers are protected during planarization.

Figure 5G:
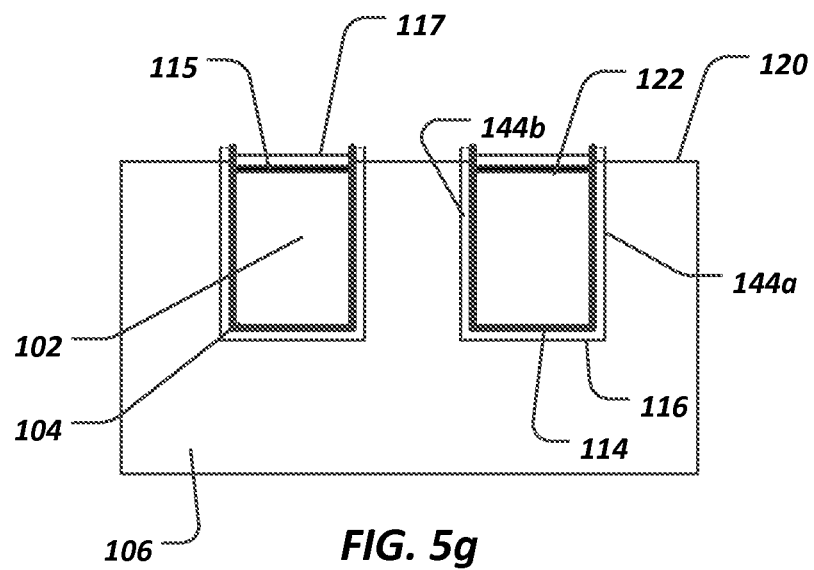
FIG. 5g illustrates a cross-section of the interlayer dielectric of FIG. 5f after planarization.

FIG. 5g illustrates the resulting metallization layer including the fully clad interconnects 102 formed in the openings 104 of the dielectric layer 106. The interconnects 102 are surrounded by the adhesion layer 114 and the adhesion capping layer 115. And, the adhesion layer and adhesion capping layer are surrounded by the diffusion barrier layer 116 and diffusion capping layer 117. Furthermore, the interconnects 102 are recessed within the side walls 144a, 144b of the adhesion layer 114 and diffusion barrier layer 116 and the adhesion capping layer 114 is also recessed within the side walls 144a, 144b of the adhesion layer 114 and diffusion barrier layer 116. In embodiments, the diffusion barrier capping layer 117 is also recessed within the side walls 144a, 144b of the adhesion layer 114 and diffusion barrier layer 116.

Optionally, with reference again to FIG. 4, an additional process is performed 418 to remove the dielectric material on either side of the fully clad interconnects, forming an air gap between the interconnects. In embodiments of forming the air gaps, the surface of the dielectric and interconnects are patterned using photolithography as described above, to mask the interconnects and form openings in the dielectric layer, removing the dielectric material on either side of the fully clad interconnect.

Figure 5H:
FIG. 5h illustrates a cross-section of a sacrificial dielectric layer formed over a dielectric substrate.

In another embodiment, a sacrificial dielectric layer is deposited over a dielectric substrate. FIG. 5h illustrates the arrangement of the sacrificial dielectric 150 over the dielectric substrate 152. The dielectric substrate is formed from the dielectric materials described above. In embodiments, the sacrificial layer is formed of a silicon containing material, such as carbon doped silicon, silicon dioxide, silicon oxynitride, or silicon oxyfluoride, or porous silicon dioxide.

The sacrificial layer is patterned to form the openings in which the interconnects are formed, following the process illustrated in FIG. 4. After forming the interconnects and capping the interconnects, the sacrificial dielectric located on either side of the interconnects are removed at 418 using an organic hydrogen solution, such as tetra methyl ammonium hydroxide (TMAH) based solution including hypochlorite ions such as potassium hypochlorite ions at a pH in the range of 12 to 14. The TMAH is present at a concentration in the range of 1% to 10% by volume, including all values and ranges therein, such as 5% to 10% by volume including all values and ranges therein, and the hypochlorite ions are present at a concentration in the range of 5% to 15% by volume including all values and ranges therein. The remainder of the solution being water.

Figure 5I:
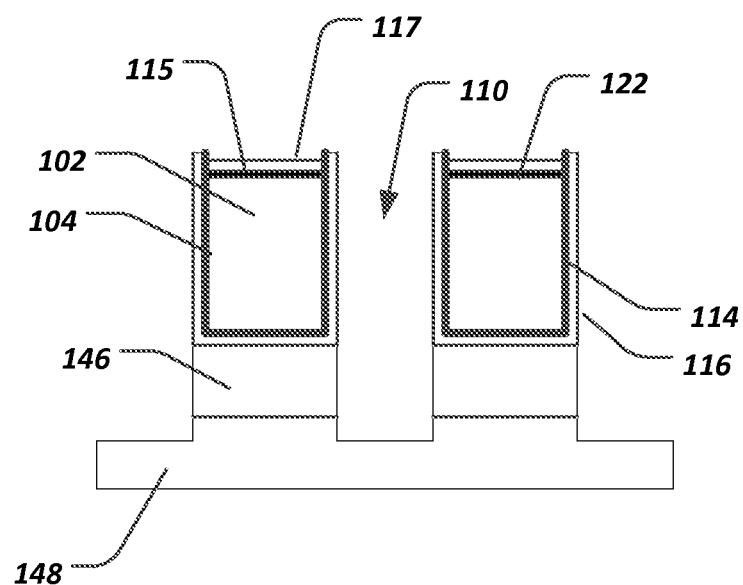
FIG. 5i illustrates a cross-section of an embodiment of interconnects formed over a dielectric including air gaps between the interconnects.

FIG. 5i illustrates the resulting fully clad interconnects 102, supported by the remaining dielectric material 146, 148. Stated another way, the interconnect 102 is completely surrounded by a barrier layer 108 formed from an adhesion layer 114, a diffusion layer 116 as well as an adhesion capping layer 115, and diffusion barrier capping layer 117. Air gaps 110 are present between adjacent interconnects 102 and a layer of dielectric material 146, 148 remains below the interconnects 102.

In other embodiments, the sacrificial layer is formed of a polymer material, such as polypropylene oxide, polyoxymethylene, polycaprolactone, polycarbonate, polyamide imide, polyamide-6,6, polyphthalamide, polybutylene terephthalate, polyethylene terephthalate, polystyrene, syndio-tactic polystyrene, polyphenylene sulfide, polyether sulfone, polynorbornene, poly(p-xylylene) polymer dielectrics, poly(aryl ether) based polymer dielectrics, fluorinated polymers, polyhydroxystyrene polymers. After forming the interconnects, the sacrificial layer may be removed in a chemical treatment by exposing the sacrificial material to an etchant such as hydrofluoric acid in either liquid or vapor form, or a combination of thermo and chemical techniques. In yet further embodiments, the sacrificial layer may be decomposed utilizing an electron beam or exposure of the sacrificial layer to light.

Reference to "top", "bottom", "upper", "sides", etc., are introduced for the ease of understanding the description herein and should not be considered as limiting to a specific orientation.

EXAMPLES

Example 1

Samples were prepared according to the methods described above. Specifically, a low-k carbon doped oxide (CDO) interlayer dielectric was patterned into a test pattern using photolithography to create openings in the interlayer dielectric having an average depth of 120 nm and an average width of 30 nm. A tantalum nitride diffusion barrier was then deposited on the interlayer dielectric using physical vapor deposition. A reactive gas of $N_2$ was supplied to a process chamber housing the interlayer dielectric at a flow rate of 45 sccm. A tantalum target is placed within the chamber. During deposition, the process chamber was maintained at a pressure of 2.5 mTorr and a temperature of 17° C. The wafer is biased in the range of −70 V to −80 V. A tantalum nitride diffusion barrier having a thickness of 1-2 nm was deposited. After depositing the diffusion barrier, a tantalum adhesion layer was deposited using the sputtering technique described above. The film was deposited at 100° C. by non-reactive argon (Ar) sputtering using a wafer bias in the range of −70 V to −80 V. The base pressure of the vacuum chamber was $10^{-8}$ torr. A conformal coating of the tantalum adhesion layer having a thickness of 1-2 nm was formed.

Then copper interconnect material was deposited using physical vapor deposition and electroplating. A copper target was used in combination with Ar gas. During deposition, the process chamber housing the interlayer dielectric was maintained at a pressure of 0.5 mtorr. and the Ar gas was supplied at a feed rate of 4 sccm. A coating of copper having a thickness of 500 Angstroms was formed. After seeding, the interconnect was formed by electroplating the copper onto the dielectric. The dielectric is placed in a solution of copper sulfate and sulfuric acid. A current density of 50 $mA/cm^2$ was applied. Additional copper was deposited. The copper was then reflowed at a temperature of 350° C. for 1 minute to 2 minutes, wherein the copper flowed into the openings of the interlayer dielectric. The upper surface of the copper interconnect was recessed between 5 nm to 10 nm from the upper surface of the interlayer dielectric.

Then a capping layer of a 2-3 nm thick tantalum and a capping layer of 2-3 nm thick tantalum nitride were applied using the physical vapor deposition processes described above. The overburden was planarized using chemical mechanical planarization to expose the surface of the interlayer dielectric. Due to the recess of the interconnect, the capping layers were protected during the planarization process.

Comparative Example

Copper interconnects were created using a damascene process following the same test pattern. The interlayer dielectric was patterned using the same process described above. A diffusion barrier of tantalum was deposited using physical vapor deposition in the patterned openings. Then copper was applied to the dielectric layer using electroplating. First a seed layer was deposited using physical vapor deposition, wherein a target of copper is used. Argon gas was supplied into the process chamber holding the interlayer dielectric at a rate of 4 sccm and the process chamber was kept at a pressure of 0.5 mTorr. A 500 angstrom thick layer of copper was deposited.

After seeding, the interconnect was formed by electroplating the copper onto the dielectric layer. The interlayer dielectric is placed in a solution of copper sulfate and sulfuric acid. A current density of 50 mA/cm$^2$ was applied for a time period of 60 seconds. The patterned openings were filled with copper and an overburden formed over the dielectric. The overburden was then removed using chemical mechanical planarization leveling the upper surface of the interconnect with the upper surface of the interlayer dielectric.

Then an etch stop of SiC:H was deposited over the copper interconnect and dielectric layer using plasma assisted chemical vapor deposition creating a hermetic barrier. The reactive gas was trimethylsilane (TMS), which was supplied to the process chamber at a rate of 50 sccm. The process chamber was held at a pressure of 200 mTorr and a temperature of 350 C during the deposition process.

Testing

Figure 6:
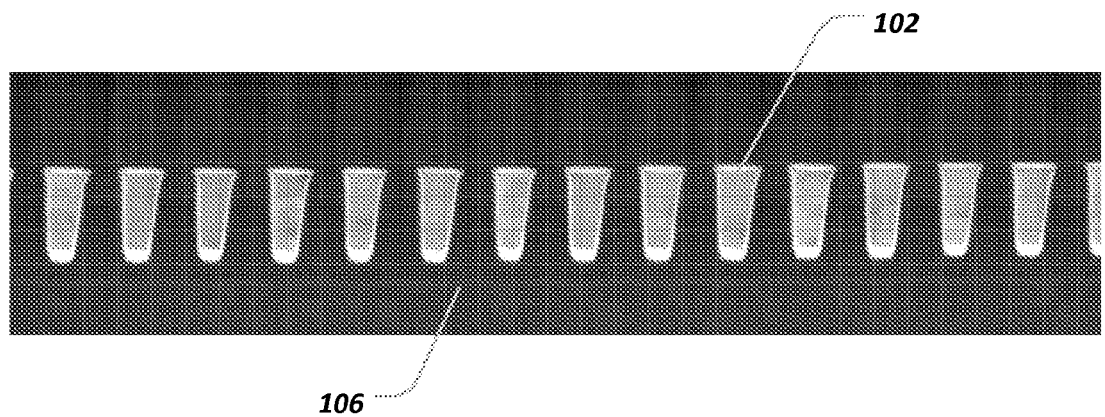
FIG. 6 illustrates a transmission electron microscope image of a cross-section of a plurality of interconnects formed in an interlayer dielectric.
Figure 7:
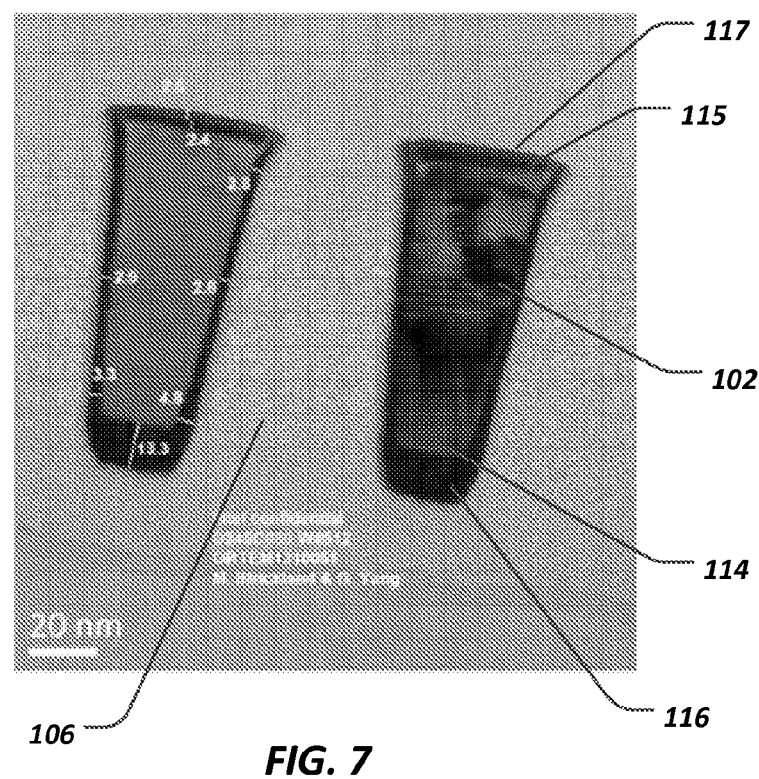
FIG. 7 illustrates a transmission electron microscope image of a cross-section of an embodiment of two interconnects formed in an interlayer dielectric.

The interconnects formed by Example 1 and the Comparative Example were electromigration tested. First, the interconnects were subjected to a 300° C. bake test for 50 hours in an ambient, oxygen containing atmosphere. After bake testing, TEM images were taken of the interconnects 102 formed in the dielectric layer 106 according to the process of Example 1 as seen in FIGS. 6 and 7. FIG. 7 illustrates a scale of 20 nm in the lower left hand corner. The images were taken at a magnification of 50 kx to 500 kx, an acceleration voltage of 5 kV and a working distance of 0.1 mm to 1.0 mm.

Figure 8:
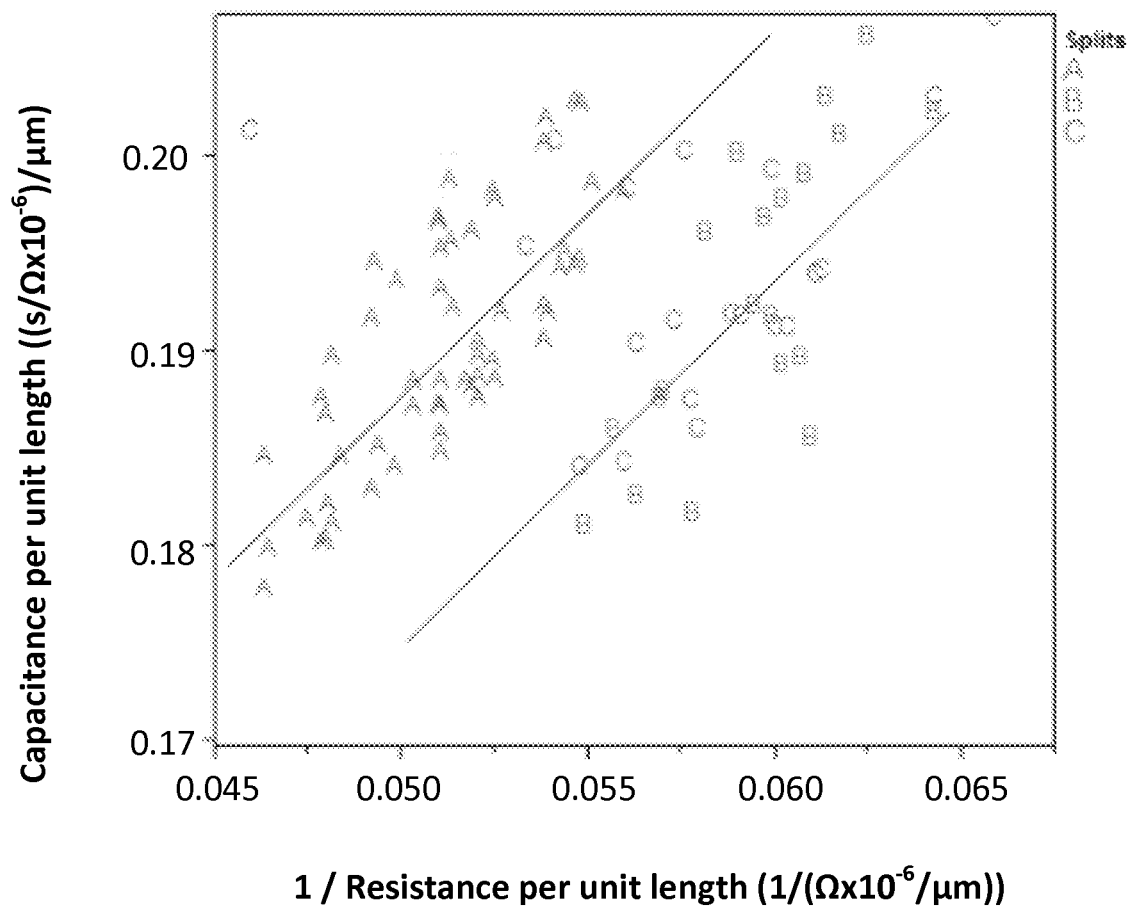
FIG. 8 illustrates comparative results of electromigration testing of interconnects created by electroplating of copper in openings including tantalum barrier layers and an etch stop capping layer, represented by points (A); and deposition and reflow of copper in openings including a tantalum nitride barrier layer and Ta adhesion layer and a capping layers of a tantalum adhesion layer and tantalum nitride barrier layer, represented by points (B) and (C)

Then electromigration tests were performed, wherein a current of 35 µA was applied to the interconnects. The capacitance per length of the interconnects were measured as compared to the resistance per length. The results of this test are illustrated in FIG. 8, wherein points A are measurements of the copper interconnects produced using the damascene process including the etch stop, points B and C are measurements of the copper interconnects produced using the methods described herein with the fully clad lines. The data illustrates that the fully clad lines without the next layer etch stop exhibit improved capacitance as compared to the lines produced using the damascene process including the layer of etch stop.

Figure 9:
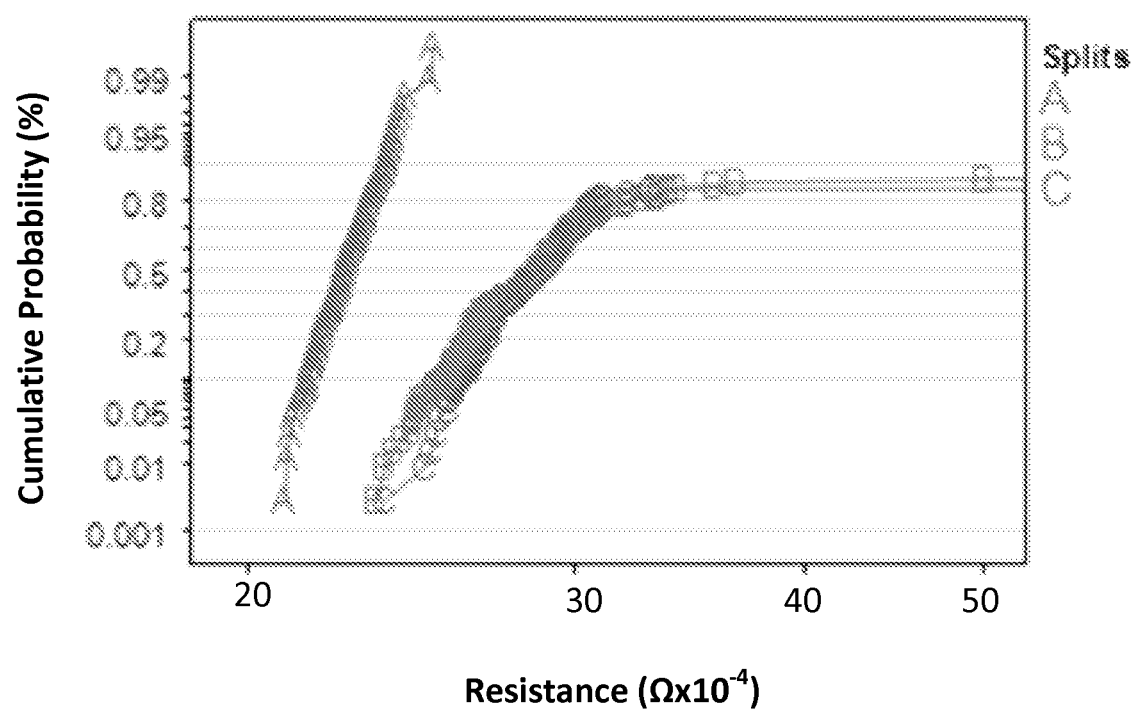
FIG. 9 illustrates the cumulative probability versus resistance for a short chain of via and metal interconnects created by electroplating of copper in openings including tantalum barrier layers and an etch stop capping layer, represented by points (A); and deposition and reflow of copper in openings including a tantalum nitride barrier layer and tantalum adhesion layer and a capping layers of a tantalum adhesion layer and tantalum nitride barrier layer, represented by points (B) and (C)

In addition, the cumulative failure distribution of the via chain was measured for the copper interconnects and is plotted in FIG. 9. The interconnect lines produced using the damascene process including the etch stop are represented by points A and the fully clad interconnects produced according to the methods described herein are represented by points B and C. This illustrates the health of the lines. The increase in resistance is consistent with the double tantalum/tantalum nitride layer at the bottom of the via landings on the fully clad lines.

Example 2

Wafers having multiple interconnect layers were produced including two copper layers using the process described herein including the fully clad interconnects and the damascene process. The additional layer was created by depositing a second layer of the interlayer dielectric over the first layer of interlayer dielectric and repeating the interconnect formation processes described above.

Figure 10:
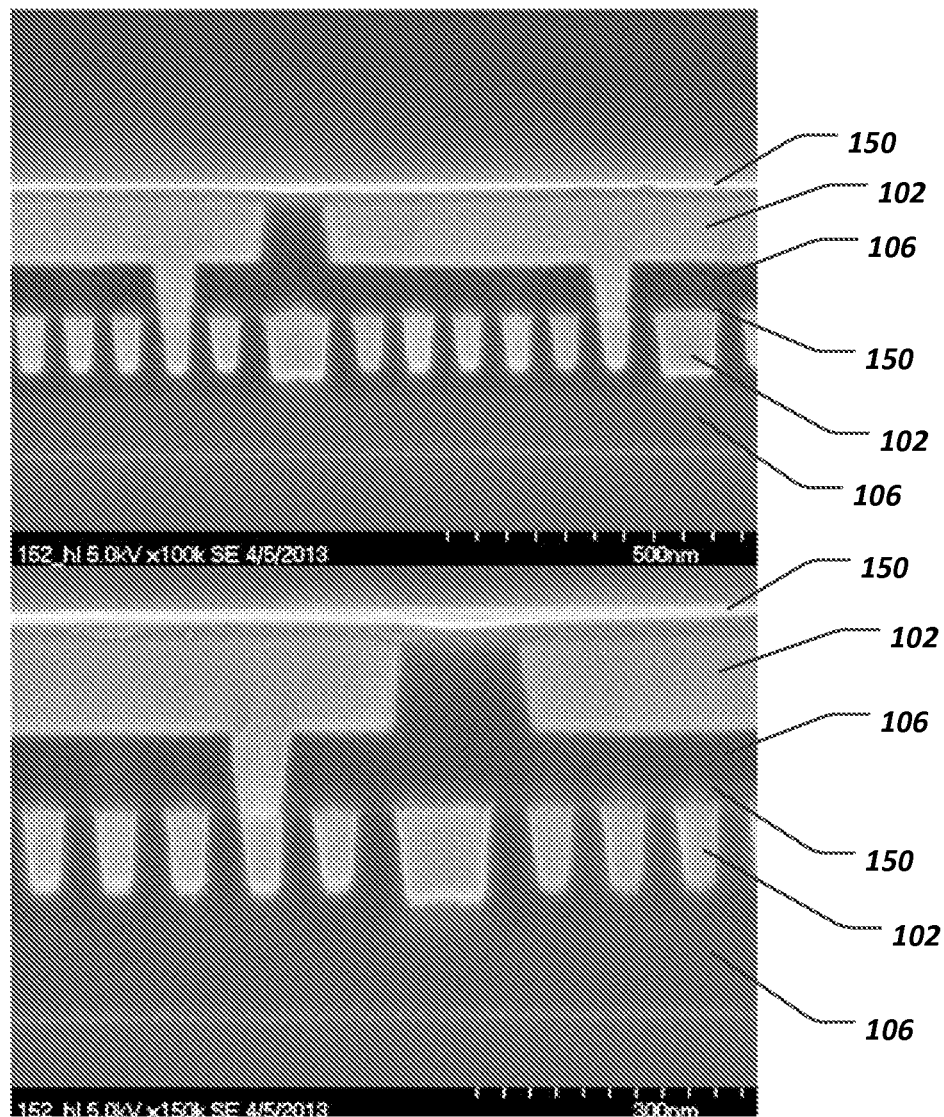
FIG. 10 illustrates a transmission electron microscope image of a cross-section of a wafer including two copper layers after an electromigration bake test of 300° C. for 50 hours in an ambient air environment.

FIG. 10 illustrates TEM images of a cross-section of the damascene copper interconnects including the SiC etch stop layer deposited over the copper interconnects. The upper image was taken at a magnification of 100 kX, an acceleration voltage of 5.0 kV and a working distance of 1 mm. The lower image was taken at a magnification of 150 kX, an acceleration voltage of 5.0 kV and a working distance of 0.5 mm. The image on the upper right illustrates a scale of 500 nm and the image on the lower right illustrates a scale of 300 nm. There were no failures in the interconnect structure after a 50 hour electromigration bake test performed at 300° C. in ambient air.

Figure 11:
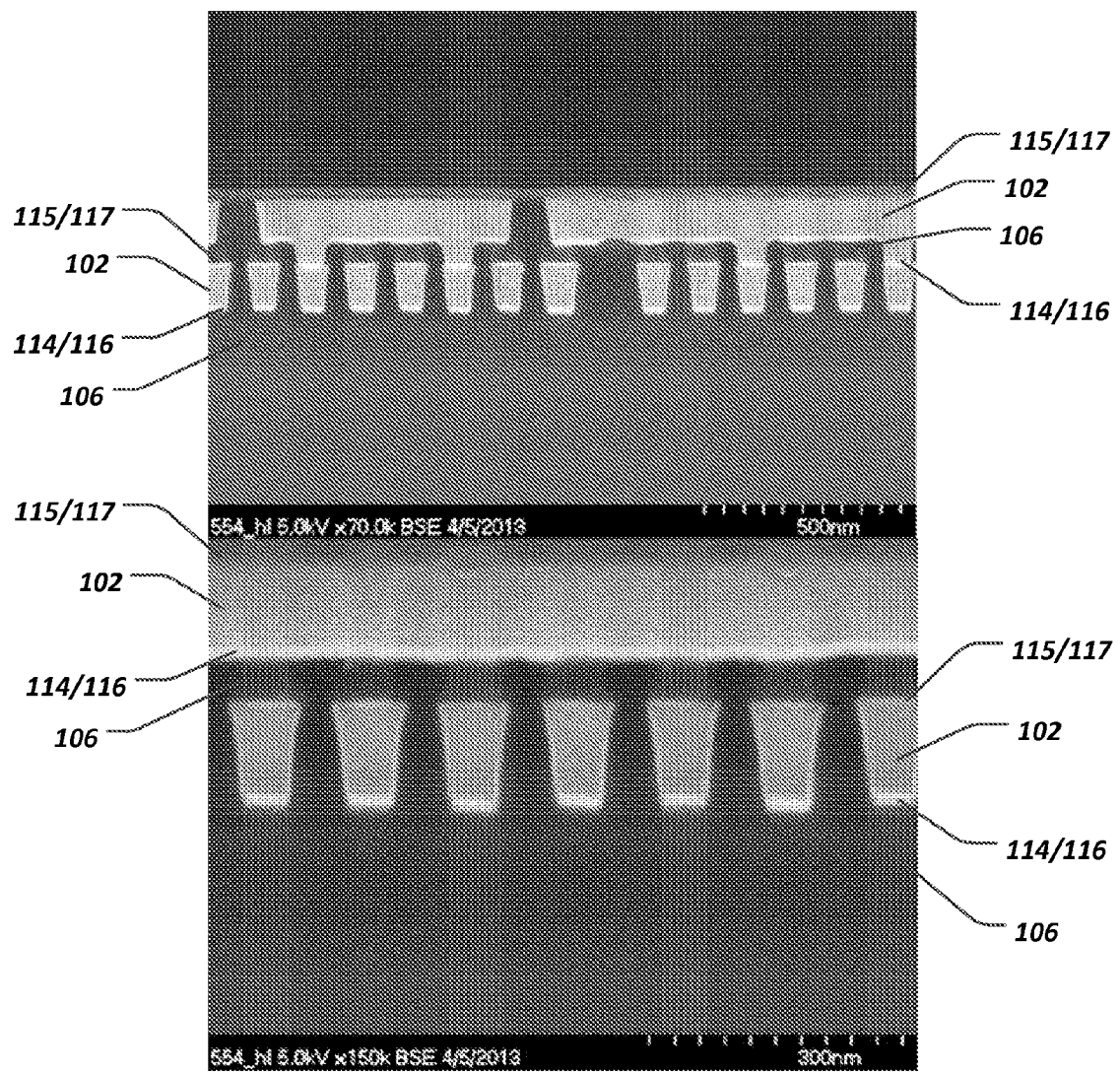
FIG. 11 illustrates a transmission electron microscope image of a cross-section of a wafer including two copper layers after an electromigration bake test of 300° C. for 50 hours in an ambient air environment.

FIG. 11 illustrates TEM images of a cross-section of the damascene copper interconnects including the fully clad lines produced according to the methods described herein. The upper image was taken at a magnification of 70 kX, an acceleration voltage of 5.0 kV and a working distance of 1 mm. The lower image was taken at a magnification of 150 kX, an acceleration voltage of 5.0 kV and a working distance of 0.5 mm. The image on the upper right illustrates a scale of 500 nm and the image on the lower right illustrates a scale of 300 nm. There were no failures in the interconnect structure after a 50 hour electromigration bake test performed at 300° C. in ambient air.

Thus, the samples produced according to methods provided herein using copper reflow and fully clad lines exhibited an improvement in capacitance and exhibited no failures under the same testing conditions as those produced using the traditional damascene process using an etch stop layer.

Accordingly, an aspect of the present disclosure relates to a method of forming a fully clad interconnect. The method includes forming an opening in a dielectric layer, wherein the dielectric layer has a surface and the opening includes walls and a bottom. The method also includes depositing a diffusion barrier layer on the dielectric layer surface, the walls and the bottom, depositing an adhesion layer on the diffusion barrier layer, depositing interconnect material on the adhesion layer, and reflowing the interconnect material into the opening forming an interconnect in the opening, wherein the interconnect is recessed below the dielectric layer surface. The method further comprises depositing an adhesion capping layer over the interconnect and depositing a diffusion barrier capping layer over the adhesion capping layer, wherein the interconnect is surrounded by the adhesion layer and the adhesion capping layer, and the adhesion layer and the adhesion capping layer are surrounded by the diffusion barrier layer and the diffusion barrier capping layer.

In an embodiment of the above, the adhesion capping layer is recessed from the dielectric layer surface. In addition, the diffusion barrier capping layer is level with the dielectric surface or the diffusion barrier capping layer is recessed from the dielectric surface.

In any of the above embodiments, the method further includes forming an overburden of one or more of the following layers over the dielectric layer: the diffusion barrier layer, the adhesion layer, the adhesion capping layer, and the diffusion barrier capping layer. The overburden is the planarized exposing the dielectric layer surface.

Further in any of the above embodiments, the adhesion capping layer is formed by physical vapor deposition using a target comprising a metal and the physical vapor deposition is performed in a process chamber including the dielectric layer and the target therein. In particular embodiments of the above, the physical vapor deposition comprises supplying an inert gas to the process chamber at a flow rate in the range of 10 sccm to 100 sccm, sputtering the metal from the target, and depositing the adhesion capping layer, wherein the process chamber is maintained at a pressure in the range of $1 \times 10^{-8}$ torr to $1 \times 10^{-1}$ torr and at a temperature in the range of 10° C. to 100° C. during deposition.

In any of the above embodiments, the diffusion barrier layer is formed by physical vapor deposition using a reactive gas and a target comprising a metal, and the physical vapor deposition is performed in a process chamber including the dielectric layer and the target therein. In particular embodiments of the above, the physical vapor deposition comprises supplying a reactive gas to the process chamber at a flow rate in the range of 10 sccm to 100 sccm, sputtering the metal from the target, and depositing the diffusion barrier layer, wherein the process chamber is maintained at a pressure in the range of $1 \times 10^{-8}$ torr to $1 \times 10^{-1}$ torr and at a temperature in the range of 10° C. to 100° C. during deposition. For example, the reactive gas is $N_2$, the flow rate is 40 sccm to 50 sccm, the pressure is in the range of 1 millitorr to 10 millitorr, and the temperature is in the range of 10° C. to 20° C.

In any of the above embodiments, the adhesion capping layer comprises tantalum and is deposited at a thickness of 1 nm to 10 nm. In addition, in any of the above embodiments, the diffusion barrier layer comprises tantalum nitride and is deposited at a thickness in the range of 1 nm to 10 nm. Further, in any of the above embodiments, the interconnect material is copper and, in examples, the copper is reflowed by exposing the copper to a temperature in the range of 200° C. to 1100° C. for a time period in the range of 1 to 5 minutes.

In any of the above embodiments, the method further includes forming a plurality of the openings in the dielectric layer and forming a plurality of the interconnects, wherein each of the interconnects is formed within one of the plurality of openings, and removing a portion of the dielectric layer located between the interconnects creating an air gap between the interconnects. In such embodiments, the dielectric layer is formed, for example, by depositing a sacrificial dielectric layer over a dielectric substrate; forming the openings in the sacrificial dielectric layer, wherein the sacrificial dielectric layer located between the interconnects is removed to form the air gap.

Another aspect of the present disclosure relates to a metallization layer including an interconnect. In any embodiment, the metallization layer is formed according to the methods described above. The metallization layer includes an interconnect supported by a dielectric layer, wherein the interconnect includes a surface including opposing side surfaces, a bottom surface, and an upper surface. The metallization layer also includes a barrier layer surrounding the interconnect surface, wherein the barrier layer includes an adhesion layer disposed around the opposing side surfaces and the bottom surface between the interconnect and the dielectric layer. The barrier layer also includes a diffusion barrier layer disposed between the adhesion layer and the dielectric layer. In addition, the barrier layer an adhesion capping layer disposed over the upper surface, and a diffusion barrier capping layer disposed over the adhesion capping layer, wherein the adhesion layer and the diffusion barrier layer form side walls and the interconnect and the adhesion capping layer are recessed within the side walls.

In any of the above embodiments, the interconnect is disposed in an opening in a dielectric layer, wherein the dielectric layer has a surface, and the upper surface of the interconnect is recessed below the surface of the dielectric layer. Further, in any of the above embodiments, a plurality of the interconnects are present, wherein air gaps are present between the interconnects.

In addition, in any of the above embodiments, the adhesion layer and the adhesion capping layer are formed of tantalum. In any of the above embodiments, the diffusion barrier layer and the diffusion barrier capping layer are formed of tantalum nitride. In any of the above embodiments, the interconnect is formed of copper.

In any of the above embodiments, the metallization layer is present in an integrated circuit.

Yet, a further aspect of the present disclosure relates to an integrated circuit. The integrated circuit includes a plurality of interconnects connected to one or more components associated with the integrated circuit, wherein the interconnects are supported by one or more dielectric layers and each interconnect includes a surface including opposing side surfaces, a bottom surface, and an upper surface. The integrated circuit also includes a barrier layer surrounding the interconnect surface, wherein the barrier layer includes an adhesion layer disposed around the opposing side surfaces and the bottom surface between the interconnect and the dielectric layer, a diffusion barrier layer disposed between the adhesion layer and the dielectric layer, an adhesion capping layer disposed over the upper surface, and a diffusion barrier capping layer disposed over the adhesion capping layer, wherein the adhesion layer and the diffusion barrier layer form side walls and the interconnect and the adhesion capping layer are recessed within the side walls.

In any of the above embodiments, each of the interconnects are disposed in an opening in a dielectric layer having a surface and the upper surface of the interconnect is recessed from the surface of the dielectric layer. In particular embodiments, air gaps are present between the interconnects.

In any of the above embodiments, the adhesion layer and the adhesion capping layer are formed of tantalum. In any of the above embodiments, the diffusion barrier layer and the diffusion barrier capping layer are formed of tantalum nitride. In any of the above embodiments, the interconnect is formed of copper. Further, in any of the above embodiments, the interconnect has been subjected to a reflow process.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A fully-cladded interconnect device, comprising:
   a base comprising a dielectric layer said dielectric layer comprising a first region and at least one second region adjacent said first region, the at least one second region having a first upper surface;

an interconnect structure on the first region, the interconnect structure comprising:
  a diffusion barrier layer on the first region of the dielectric layer, the diffusion barrier layer comprising a first horizontal portion on said bottom and first sidewalls on said opposing first and second sides, wherein the first sidewalls extend generally perpendicular to said first horizontal portion and comprise a first inner surface, a first outer surface, and a second upper surface;
  an adhesion layer at least partially defining a cavity, wherein the adhesion layer comprises a second horizontal portion on said first horizontal portion and second sidewalls on the first inner surface of said first sidewalls, the second sidewalls comprising a second inner surface, a second outer surface, and a third upper surface;
  an interconnect disposed in said cavity, said interconnect comprising opposing interconnect side surfaces, an interconnect bottom surface, and an interconnect upper surface, wherein said opposing interconnect side surfaces and said interconnect bottom surface are in contact with said second sidewalls and second horizontal portion of said adhesion layer, respectively; and
  a capping layer disposed on said interconnect upper surface said capping layer comprising an adhesion capping layer in contact with said interconnect upper surface of said interconnect and a diffusion barrier capping layer disposed on said adhesion capping layer, the diffusion barrier capping layer comprising a fourth upper surface;
wherein:
  the first upper surface is recessed below the second and third upper surfaces; and
  the fourth upper surface is recessed below said second and third upper surfaces.

2. The fully-cladded interconnect device of claim 1, wherein said interconnect upper surface is recessed below said first upper surface of said dielectric layer by a distance D, wherein D ranges from about 1 to about 20% of a height of said interconnect.

3. The fully-cladded interconnect device of claim 1, further comprising an air gap, wherein said first outer surface of said diffusion barrier layer is in contact with said air gap.

4. The fully-cladded interconnect device of claim 1, wherein said diffusion barrier layer comprises Tantalum Nitride or Titanium Nitride.

5. The fully-cladded interconnect device of claim 1, wherein said diffusion barrier layer has a thickness ranging from about 1 nm to about 10 nm.

6. The fully-cladded interconnect device of claim 1, wherein said adhesion layer comprises Tantalum, Titanium, Ruthenium or Cobalt.

7. The fully-cladded interconnect device of claim 1, wherein said adhesion layer has a thickness ranging from about 1 nm to about 10 nm.

8. The fully-cladded interconnect device of claim 1, wherein said diffusion barrier capping layer is made from a same material as said diffusion barrier layer.

9. The fully-cladded interconnect device of claim 1, wherein said interconnect comprises copper, said adhesion capping layer comprises tantalum, and said diffusion barrier capping layer comprises tantalum nitride.

10. A metallization layer for a semiconductor device, comprising:
  a base comprising a dielectric layer, the dielectric layer comprising a first region and at least one second region adjacent the first region, the at least one second region having a first upper surface;
  an interconnect structure formed on the at least one first region, the interconnect structure comprising:
    a dielectric layer comprising at least one opening having a bottom and opposing first and second sides, said dielectric layer further comprising a first upper surface;
    a diffusion barrier layer in the at least one opening, the diffusion barrier layer comprising first sidewalls on said first and second sides, wherein the first sidewalls extend generally perpendicular to said bottom of said dielectric layer and comprise a first inner surface, a first outer surface, and a second upper surface;
    an adhesion layer at least partially defining a cavity in the at least one opening, wherein the adhesion layer comprises second sidewalls on the first inner surface of said first sidewalls, the second sidewalls comprising a second inner surface, a second outer surface, and a third upper surface;
    an interconnect in said cavity, the interconnect comprising an interconnect upper surface; and
    a capping layer on the interconnect upper surface, the capping layer comprising an adhesion capping layer on said interconnect upper surface and a diffusion barrier capping layer on said adhesion capping layer, the diffusion barrier capping layer comprising a fourth upper surface
  wherein:
    the first upper surface is recessed below the second and third upper surfaces; and
    the fourth upper surface is recessed below the second and third upper surfaces.

11. The metallization layer of claim 10, further comprising a plurality of said interconnect structures, wherein an air gap is present between a respective two of said plurality of interconnect structures.

12. The metallization layer of claim 10, wherein said diffusion barrier layer and said diffusion barrier capping layer each comprise Tantalum Nitride or Titanium Nitride.

13. The metallization layer of claim 10, wherein said adhesion layer and said adhesion capping layer each comprise Tantalum, Titanium, Ruthenium or Cobalt.

14. An integrated circuit, comprising:
  a base comprising a dielectric layer, the dielectric layer comprising a first region and at least one second region adjacent the first region, the at least one second region having a first upper surface
  an interconnect structure formed on the at least one first region, the interconnect structure comprising:
    a dielectric layer comprising at least one opening having a bottom and opposing first and second sides, said dielectric layer further comprising a first upper surface;
    a diffusion barrier layer in the at least one opening, the diffusion barrier layer comprising first sidewalls on said first and second sides, wherein the first sidewalls extend generally perpendicular to said bottom of said dielectric layer and comprise a first inner surface, a first outer surface, and a second upper surface;
    an adhesion layer at least partially defining a cavity in the at least one opening, wherein the adhesion layer comprises second sidewalls on the first inner surface of said first sidewalls, the second sidewalls comprising a second inner surface, a second outer surface, and a third upper surface;

an interconnect in said cavity, the interconnect comprising an interconnect upper surface; and a capping layer on the interconnect upper surface, the capping layer comprising an adhesion capping layer on said interconnect upper surface and a diffusion barrier capping layer on said adhesion capping layer, the diffusion barrier capping layer comprising a fourth upper surface wherein:

the first upper surface is recessed below the second and third upper surfaces; and the fourth upper surface is recessed below the second and third upper surfaces.

15. The integrated circuit of claim 14, further comprising a plurality of said interconnect structures, wherein an air gap is present between a respective two of said plurality of interconnect structures.

16. The integrated circuit of claim 14, wherein said diffusion barrier layer comprises Tantalum Nitride or Titanium Nitride, and wherein said adhesion layer comprises Tantalum, Titanium, Ruthenium or Cobalt.

17. The integrated circuit of claim 14, wherein said interconnect comprises copper, said adhesion capping layer comprises tantalum, and said diffusion barrier capping layer comprises tantalum nitride.

* * * * *